United States Patent
Mokhlesi et al.

(10) Patent No.: US 7,966,550 B2
(45) Date of Patent: *Jun. 21, 2011

(54) SOFT BIT DATA TRANSMISSION FOR ERROR CORRECTION CONTROL IN NON-VOLATILE MEMORY

(75) Inventors: Nima Mokhlesi, Los Gatos, CA (US); Henry Chin, Palo Alto, CA (US); Dengtao Zhao, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 1075 days.

This patent is subject to a terminal disclaimer.

(21) Appl. No.: 11/694,947

(22) Filed: Mar. 31, 2007

(65) Prior Publication Data

US 2008/0244338 A1    Oct. 2, 2008

(51) Int. Cl.
*H03M 13/00* (2006.01)
(52) U.S. Cl. .................... 714/780; 714/773
(58) Field of Classification Search .................. 714/773, 714/780

See application file for complete search history.

(56) References Cited

U.S. PATENT DOCUMENTS

| | | | | |
|---|---|---|---|---|
| 4,397,022 A * | 8/1983 | Weng et al. | .................. | 714/783 |
| 5,091,945 A * | 2/1992 | Kleijn | .................. | 704/219 |
| 5,657,354 A * | 8/1997 | Thesling et al. | .................. | 375/332 |
| 5,822,225 A * | 10/1998 | Quaderer et al. | .................. | 702/89 |
| 6,023,783 A * | 2/2000 | Divsalar et al. | .................. | 714/792 |
| 6,041,001 A * | 3/2000 | Estakhri | .................. | 365/200 |
| 6,134,140 A * | 10/2000 | Tanaka et al. | .................. | 365/185.03 |
| 6,208,560 B1 * | 3/2001 | Tanaka et al. | .................. | 365/185.22 |
| 6,209,113 B1 * | 3/2001 | Roohparvar | .................. | 714/773 |
| 6,226,200 B1 * | 5/2001 | Eguchi et al. | .................. | 365/185.19 |
| 6,434,055 B2 * | 8/2002 | Tanaka et al. | .................. | 365/185.3 |
| 6,516,455 B1 * | 2/2003 | Teig et al. | .................. | 716/7 |
| 6,574,146 B2 * | 6/2003 | Micheloni et al. | .................. | 365/185.2 |
| 6,581,182 B1 * | 6/2003 | Lee | .................. | 714/795 |
| 6,621,739 B2 | 9/2003 | Gonzalez et al. | | |
| 6,671,852 B1 * | 12/2003 | Ariel et al. | .................. | 714/793 |

(Continued)

FOREIGN PATENT DOCUMENTS

WO    WO2004/112040 A    12/2004

OTHER PUBLICATIONS

U.S. Appl. No. 11/694,948, filed Mar. 31, 2007.

(Continued)

*Primary Examiner* — Joseph D Torres
(74) *Attorney, Agent, or Firm* — Vierra Magen Marcus & DeNiro LLP

(57) ABSTRACT

Data stored in non-volatile storage is decoded using iterative probabilistic decoding. An error correcting code such as a low density parity check code may be used. In one approach, initial reliability metrics, such as logarithmic likelihood ratios, are used in decoding sensed states of a set of non-volatile storage element. The decoding attempts to converge by adjusting the reliability metrics for bits in code words which represent the sensed state. Soft data bits are read from the memory if the decoding fails to converge. Initial reliability metric values are provided after receiving the hard read results and at each phase of the soft bit operation(s). In one embodiment, a second soft bit is read from the memory using multiple subsets of soft bit compare levels. While reading at the second subset of compare levels, decoding can be performed based on the first subset data.

17 Claims, 13 Drawing Sheets

U.S. PATENT DOCUMENTS

| | | | |
|---|---|---|---|
| 6,683,817 B2* | 1/2004 | Wei et al. | 365/230.03 |
| 6,850,441 B2 | 2/2005 | Mokhlesi et al. | |
| 6,988,175 B2 | 1/2006 | Lasser | |
| 6,999,366 B2* | 2/2006 | Perner et al. | 365/209 |
| 7,000,168 B2* | 2/2006 | Kurtas et al. | 714/755 |
| 7,031,090 B2* | 4/2006 | Ichihara et al. | 360/65 |
| 7,237,181 B2* | 6/2007 | Richardson | 714/780 |
| 7,533,328 B2* | 5/2009 | Alrod et al. | 714/786 |
| 7,555,070 B1* | 6/2009 | Ulriksson et al. | 375/341 |
| 7,558,109 B2* | 7/2009 | Brandman et al. | 365/185.03 |
| 7,599,224 B2* | 10/2009 | Lee | 365/185.22 |
| 7,606,070 B2* | 10/2009 | Mokhlesi | 365/185.17 |
| 7,710,674 B2* | 5/2010 | Esumi et al. | 360/46 |
| 2003/0217323 A1 | 11/2003 | Guterman et al. | |
| 2005/0160350 A1 | 7/2005 | Dror et al. | |
| 2006/0028875 A1 | 2/2006 | Avraham et al. | |
| 2006/0101193 A1 | 5/2006 | Murin | |
| 2006/0140010 A1* | 6/2006 | Bedarida et al. | 365/185.28 |
| 2007/0070696 A1 | 3/2007 | Avraham | |
| 2007/0086239 A1 | 4/2007 | Litsyn et al. | |
| 2007/0089034 A1 | 4/2007 | Litsyn et al. | |
| 2007/0091677 A1 | 4/2007 | Lasser | |
| 2007/0104300 A1* | 5/2007 | Esumi et al. | 375/346 |
| 2007/0104301 A1* | 5/2007 | Esumi et al. | 375/346 |
| 2007/0110188 A1* | 5/2007 | Esumi et al. | 375/324 |
| 2007/0124649 A1* | 5/2007 | Esumi et al. | 714/770 |
| 2007/0168837 A1 | 7/2007 | Murin | |
| 2007/0171714 A1* | 7/2007 | Wu et al. | 365/185.09 |
| 2007/0171730 A1* | 7/2007 | Ramamoorthy et al. | 365/185.33 |
| 2007/0237006 A1 | 10/2007 | Murin et al. | |
| 2007/0283214 A1 | 12/2007 | Lasser | |
| 2008/0010581 A1* | 1/2008 | Alrod et al. | 714/763 |
| 2008/0082897 A1* | 4/2008 | Brandman et al. | 714/763 |
| 2008/0092014 A1* | 4/2008 | Brandman et al. | 714/763 |
| 2008/0092015 A1* | 4/2008 | Brandman et al. | 714/763 |
| 2008/0092026 A1* | 4/2008 | Brandman et al. | 714/793 |
| 2008/0109702 A1* | 5/2008 | Brandman | 714/763 |
| 2008/0109703 A1* | 5/2008 | Brandman | 714/763 |
| 2008/0123420 A1* | 5/2008 | Brandman et al. | 365/185.09 |
| 2008/0151617 A1* | 6/2008 | Alrod et al. | 365/185.2 |
| 2008/0244338 A1* | 10/2008 | Mokhlesi et al. | 714/702 |
| 2008/0244360 A1* | 10/2008 | Mokhlesi et al. | 714/758 |
| 2008/0244367 A1* | 10/2008 | Chin et al. | 714/800 |
| 2008/0244368 A1* | 10/2008 | Chin et al. | 714/800 |
| 2008/0301523 A1* | 12/2008 | Eudes | 714/758 |

OTHER PUBLICATIONS

S. Kirkpatrick, C.D. Gelatt Jr., M.P. Vecchi, M.P., "Optimization by Simulated Annealing," Science, vol. 220, No. 4598, May 13, 1983.

Neal, Radford M., "Monte Carlo Decoding of LDPC Codes," Dept. of Statistics and Dept. of Computer Science, University of Toronto, May 2001.

U.S. Appl. No. 11/536,286, filed Sep. 28, 2006.

U.S. Appl. No. 11/556,632, filed Nov. 3, 2006.

D. Mackay, "Information Theory, Inference and Learning Algorithms," Cambridge University Press 2003, Chapter 47.

F. Sun, K. Rose, and T. Zhang, "On the Use of Strong BCH Codes for Improving Multilevel NAND Flash Memory Storage Capacity," IEEE Workship on Signal Processing (SiPS): Design and Implementation, Oct. 2006.

N. Shibata, et al., A 70nm 16 Gb 16-level-cell NAND Flash Memory, 2007 Symp. on VLSI Circuits Digest of Technical Papers, pp. 190-191, Jun. 14-16, 2007.

Y. Zhang, et al., "An Integrated Phase Change Memory Cell With Ge Nanowire Diode for Cross-Point Memory," 2007 Symp. on VLSI Circuits Digest of Technical Papers, pp. 98-99, Jun. 14-16, 2007.

D.H. Kang, et al., "Novel Heat Dissipating Cell Scheme for Improving a Reset Distribution in a 512M Phase-Change Random Access Memory (PRAM)," 2007 Symp. on VLSI Circuits Digest of Technical Papers, pp. 96-97, Jun. 14-16, 2007.

H. Tanaka, et al., "Bit Cost Scalable Technology With Punch and Plug Process for Ultra High Density Flash Memory," 2007 Symps. on VLSI Circuits Digest of Technical Papers, pp. 14-15, Jun. 14-16, 2007.

International Search Report & The Written Opinion of the International Searching Authority, Patent Cooperation Treaty, Application No. PCT/US2008/057722 filed on Mar. 20, 2008, Jul. 21, 2008.

"Soft Decoding of Hard and Soft Bits Read From a Flash Memory," IP.com Journal, IP.com Inc., West Henrietta, NY, U.S., Mar. 4, 2007.

Office Action dated Aug. 19, 2010, United States Patent & Trademark Office, U.S. Appl. No. 11/694,948, filed Mar. 31, 2007.

Response to Office Action filed Sep. 17, 2010, United States Patent & Trademark Office, U.S. Appl. No. 11/694,948, filed Mar. 31, 2007.

Office Action dated Aug. 19, 2010, United States Patent & Trademark Office, U.S. Appl. No. 11/694,951, filed Mar. 31, 2007.

Office Action dated Aug. 26, 2010, United States Patent & Trademark Office, U.S. Appl. No. 11/694,950, filed Mar. 31, 2007.

Final Office Action dated Dec. 7, 2010, United States Patent & Trademark Office, U.S. Appl. No. 11/694,951, filed Mar. 31, 2007.

Response to Office Action dated Feb. 14, 2001, U.S. Appl. No. 11/694,948, filed Mar. 31, 2007.

Office Action dated Oct. 12, 2010, U.S. Appl. No. 11/694,948, filed Mar. 31, 2007.

Response A to Office Action dated Nov. 30, 2010, U.S. Appl. No. 11/674,951, filed Mar. 31, 2007.

Response A to Office Action dated Nov. 26, 2010, U.S. Appl. No. 11/694,950, filed Mar. 31, 2007.

Notice of Allowance and Fee(s) Due dated Feb. 16, 2011, United States Patent & Trademark Office. U.S. Appl. No. 11/694,950 filed Mar. 31, 2007.

Notice of Allowance and Fee(s) Due dated Mar. 3, 2011, United States Patent & Trademark Office, U.S. Appl. No. 11/694,948 filed Mar. 31, 2007.

Response to Final Office Action dated Mar. 7, 2011, U.S. Appl. No. 11/694,951 filed Mar. 31, 2007.

* cited by examiner

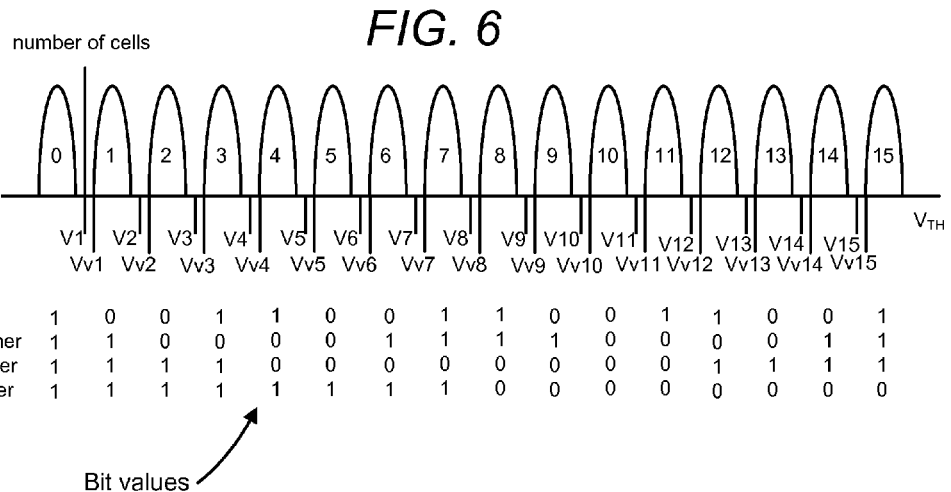
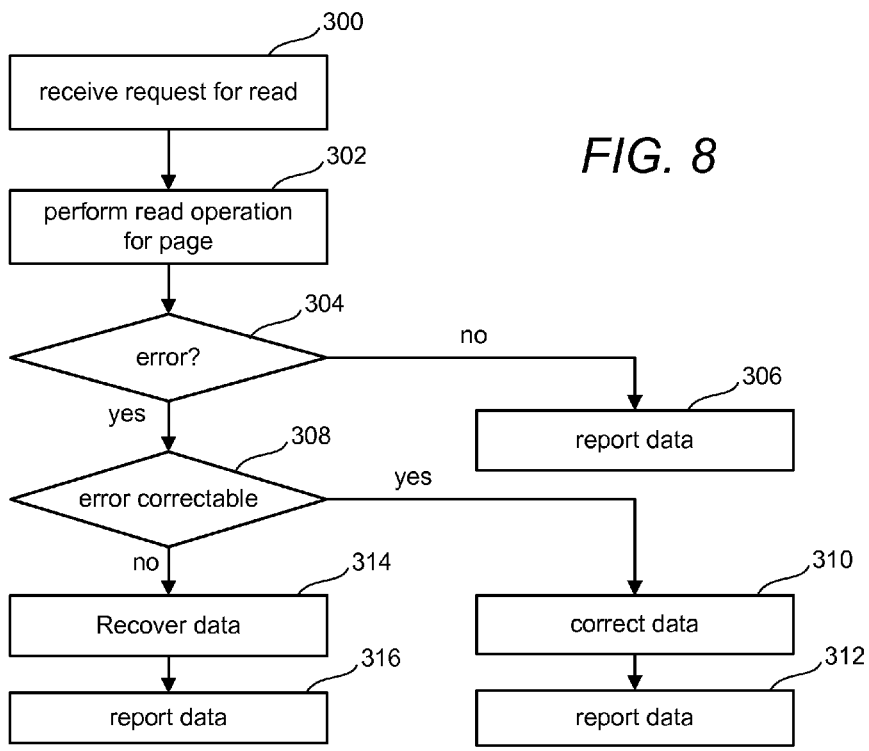

Read Result:

|  | 6(0) | 6(1) | 7(0) | 7(1) | 8(0) | 8(1) ... |
|---|---|---|---|---|---|---|
| Top | M1+5 | M1-1 | -(M1-1) | -(M1+5) | -(M1+5) | -(M1-1) |
| Higher | -(M1-1) | -(M1+5) | -(M2+6) | -(M2+6) | -(M2+6) | -(M2+6) |
| Upper | M3 | M3 | M3 | M3 | M3 | M3 |
| Lower | -(M2+6) | -(M2+6) | -(M1+5) | -(M1-1) | M1-1 | M1+5 |

Read Result:

| ... | 6(00) | 6(01) | 6(10) | 6(11) | 7(00) | 7(01) | 7(10) | 7(11) | 8(00) | 8(01) | 8(10) | 8(11) ... |
|---|---|---|---|---|---|---|---|---|---|---|---|---|
| Top | +7 | 5 | 1 | 2 | -2 | -1 | +5 | +7 | +7 | +5 | -1 | -2 |
| Higher | -2 | -1 | +5 | +7 | +6 | +6 | +6 | +6 | +6 | +6 | +6 | +6 |
| Upper | 0 | 0 | 0 | 0 | 0 | 0 | 0 | 0 | 0 | 0 | 0 | 0 |
| Lower | +6 | +6 | +6 | +6 | +7 | +5 | -1 | -2 | -2 | -1 | +5 | +7 |

|        | 6(00) | 6(01) | 6(1) | 7(0) | 7(10) | 7(11) | 8(00) | 8(01) | 8(1) |     |
|--------|-------|-------|------|------|-------|-------|-------|-------|------|-----|
| ...    |       |       |      |      |       |       |       |       |      | ... |
| Top    | +7    | +5    | -1   | -2   | +5    | +7    | +7    | +5    | -1   |     |
| Higher | -2    | -1    | +5   | +6   | +6    | +6    | +6    | +6    | +6   |     |
| Upper  | 0     | 0     | 0    | 0    | 0     | 0     | 0     | 0     | 0    |     |
| Lower  | +6    | +6    | +6   | +7   | -1    | -2    | -2    | -1    | +5   |     |

Read State:

FIG. 16

SOFT BIT DATA TRANSMISSION FOR ERROR CORRECTION CONTROL IN NON-VOLATILE MEMORY

CROSS-REFERENCE TO RELATED APPLICATIONS

This application is related to co-pending, commonly assigned U.S. patent application Ser. No. 11/694,948, filed herewith, entitled "Non-Volatile Memory with Soft Bit Data Transmission for Error Correction Control," cross-referenced and incorporated by reference herein in its entirety.

BACKGROUND OF THE INVENTION

1. Field of the Invention

Embodiments of the present disclosure are directed to non-volatile memory technology.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Another type of memory cell useful in flash EEPROM systems utilizes a non-conductive dielectric material in place of a conductive floating gate to store charge in a non-volatile manner.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is common for to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data.

SUMMARY OF THE INVENTION

Data stored in non-volatile storage is decoded using iterative probabilistic decoding. An error correcting code such as a low density parity check code may be used. In one approach, initial reliability metrics, such as logarithmic likelihood ratios, are used in decoding sensed states of a set of non-volatile storage elements. Decoding attempts to converge by adjusting the reliability metrics for bits in code words which represent the sensed state. Soft data bits can be read from the memory if the decoding fails to converge. Different initial reliability metric values are provided after receiving the hard read results and after different phases of the soft bit operation(s) when more information is received. In one embodiment, a second soft bit is read from the memory using multiple subsets of soft bit compare levels. While reading at the second subset of compare levels, decoding can be performed based on the first subset data. The different subsets of read compare levels for the second soft bit read can be selected intelligently in one embodiment based on the characteristics of different states of the memory cells. For instance, individual memory systems or groups of system can be characterized to determine the nature of shifts in the apparent or actual charge levels of memory cells after programming.

A method of reading non-volatile storage is provided in one embodiment that includes reading user data from a set of non-volatile storage elements using a first plurality of read compare points where each compare point corresponds to a programmable state of the storage elements, reading a set of soft data from the set of storage elements at a higher bit resolution than the user data using a second plurality of read compare points having a larger number of read compare points than the first plurality, and decoding the user data using a first subset of the soft data while reading to determine a second subset of the soft data.

Another method of reading non-volatile storage includes providing a set of read compare points for a plurality of non-volatile storage elements as part of an error correction control process while reading a first set of data from the storage elements. The set of read compare points includes a first subset of read compare points having one read compare point corresponding to each programmable state of the storage elements and a second subset of read compare points having one read compare point corresponding to each programmable state of the storage elements. The first subset is provided prior to the second subset. The method further includes determining a second set of data based on the first subset of read compare points and iteratively decoding the first set of data using the second set of data while providing the second subset of read compare points for the plurality of non-volatile storage elements.

A method of one embodiment provides a first logarithmic likelihood ratio table to iteratively decode a set of data read from a plurality of non-volatile storage elements using a first set of compare points, a second logarithmic likelihood ratio table to iteratively decode the first set of data using a second set of data read from the storage elements using a second set of compare points, a third logarithmic likelihood ratio table to iteratively decode the first set of data using the second set of data and a third set of data read from the storage elements, and a fourth logarithmic likelihood ratio table to iteratively decode the first set of data using the second set of data, the third set of data, and a fourth set of data read from the storage elements.

One exemplary implementation includes a set of non-volatile storage elements and one or more managing circuits in communication with the set of non-volatile storage elements. The one or more managing circuits can perform the processes described above. In one embodiment, the managing circuitry reads using error correction control by reading user data from the set of non-volatile storage elements using a first plurality of read compare points, each compare point corresponding to a programmable state of the storage elements, reading a set of soft data from the set of storage elements at a higher bit resolution than the user data using a second plurality of read compare points having a larger number of read compare points than the first plurality, and decoding the user data using a first subset of the soft data while reading to determine a second subset of the soft data.

BRIEF DESCRIPTION OF THE DRAWINGS

FIG. 6 is a graph depicting an exemplary distribution of threshold voltages for a population of memory cells, each storing four bits of data.

FIG. 8 is a flow chart describing one embodiment of a process for reading non-volatile memory.

FIG. 16 is a table that provides exemplary initial LLR values for each bit of a code word or unit of data based on a hard read result, a first soft bit read result, and a first partial soft bit read result for a second soft bit read.

DETAILED DESCRIPTION

Figure 1:
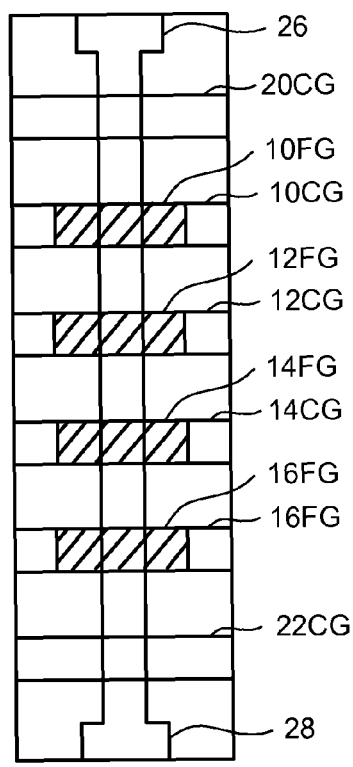
FIG. 1 is a top view of an exemplary NAND string.
Figure 2:
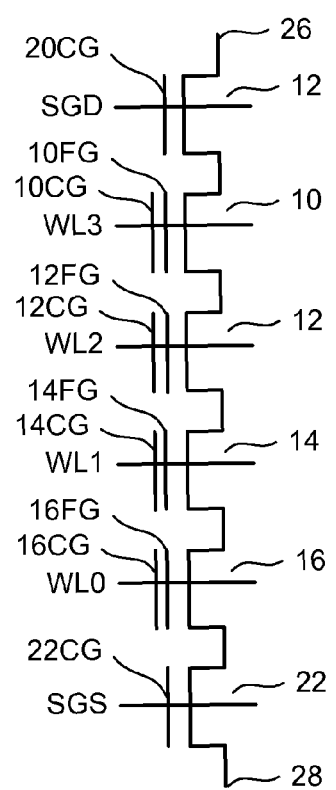
FIG. 2 is an equivalent circuit diagram of the NAND string of FIG. 1.

One example of a flash memory system uses the NAND structure, which includes multiple transistors arranged in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Relevant examples of NAND-type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. US2003/0002348). Other types of non-volatile memory in addition to NAND flash memory can also be used in accordance with embodiments.

Figure 3:
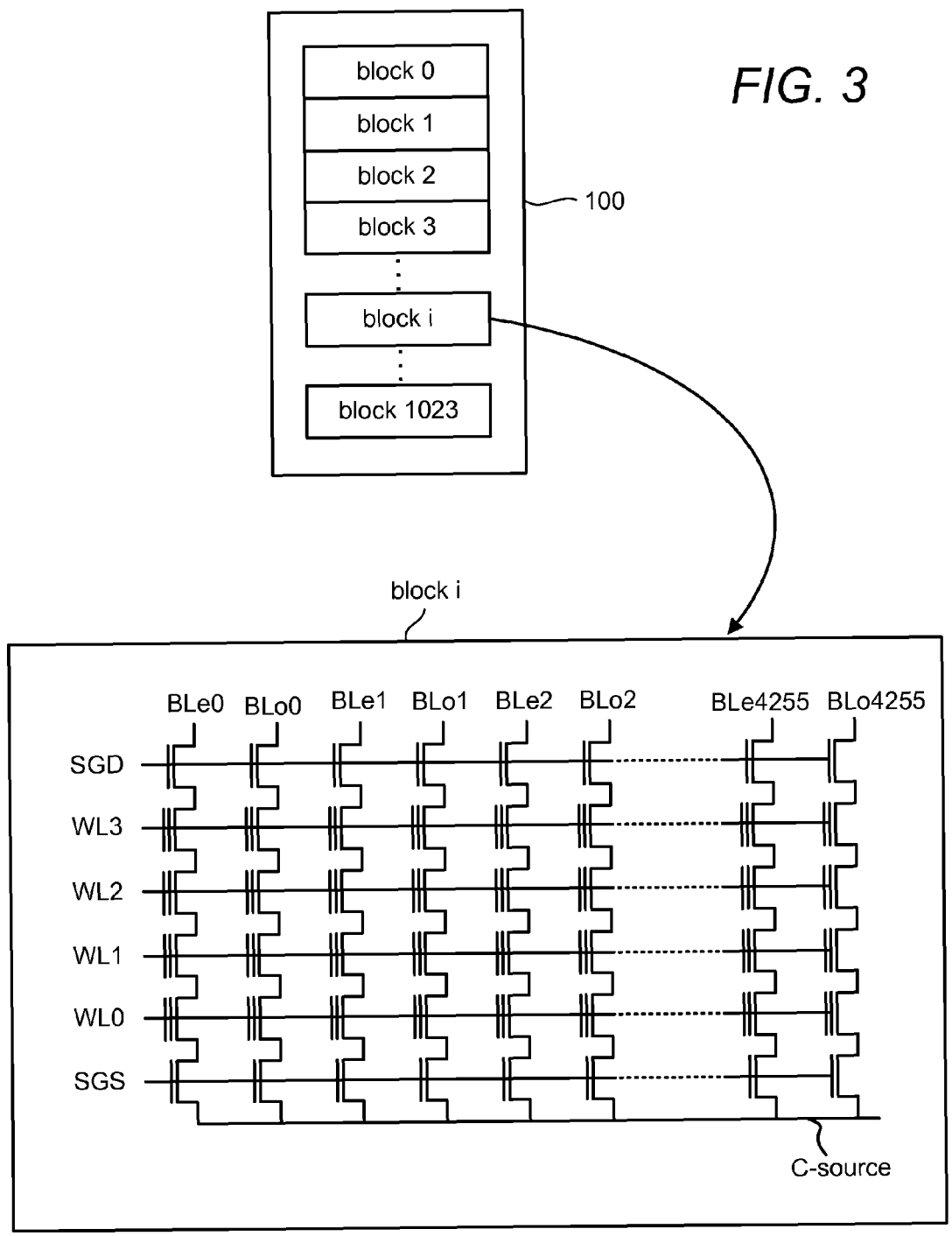
FIG. 3 is a block diagram of an exemplary array of NAND flash storage elements.

Typical architectures for flash memory using NAND structures include many NAND strings. FIG. 3 illustrates an exemplary array 100 of NAND strings, such as those shown in FIGS. 1-2. The array 100 of memory cells is divided into a large number of blocks of memory cells. As is common for flash EEPROM systems, the block is the unit of erase and may be referred to as an erase block or physical block. Each block can contain the minimum number of memory cells that are erased together, although multiple blocks may be erased simultaneously. Smaller units of cells may be erased together in some implementations.

Each block of memory cells includes a set of bit lines forming columns and a set of word lines forming rows. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain. A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Figure 4:
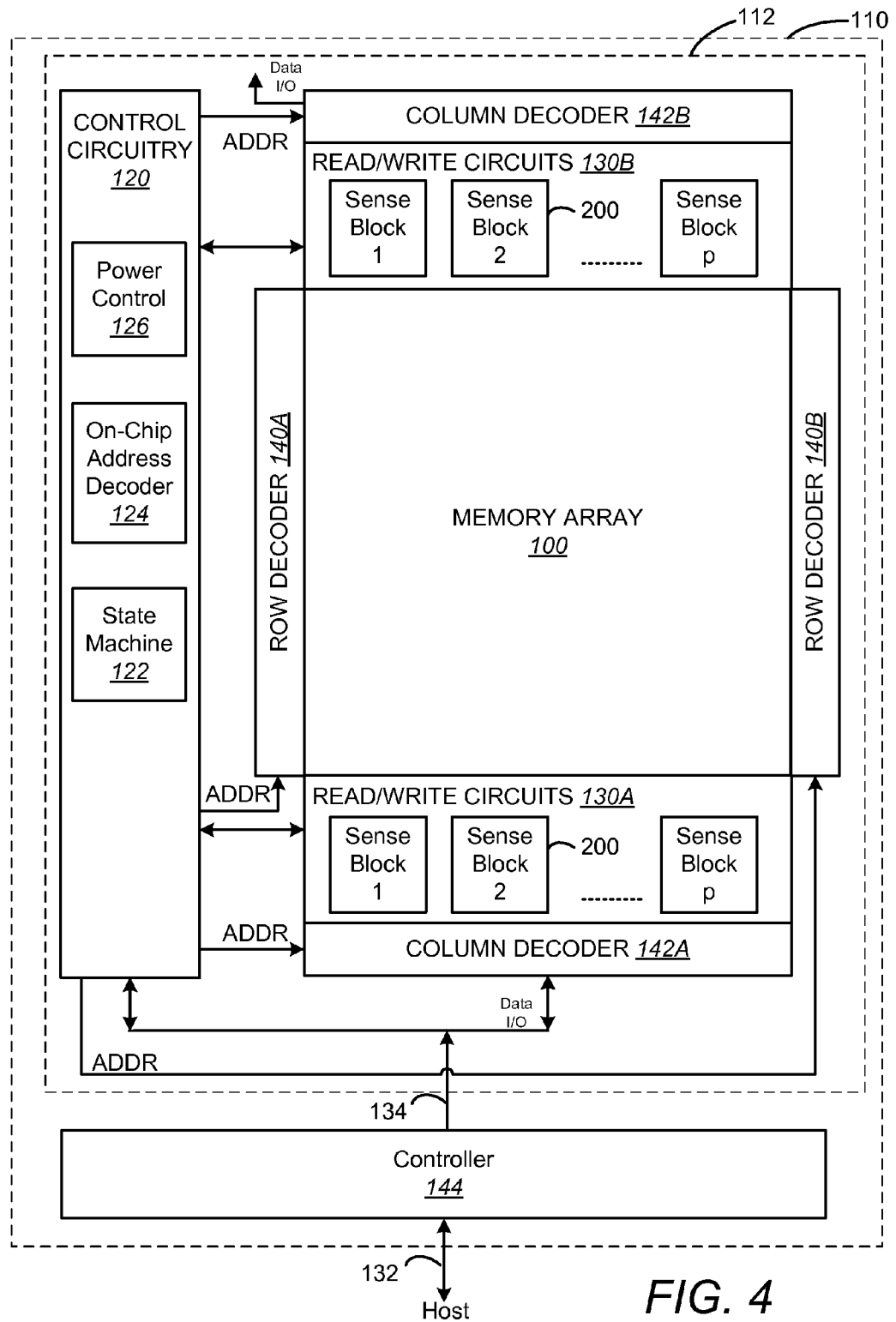
FIG. 4 is a block diagram of a non-volatile memory system in accordance with one embodiment.

Although four cells are included in each NAND string of FIG. 4, more or less than four can be used (e.g., 16, 32, or another number). One terminal of the NAND string is connected to a corresponding bit line via a first select gate (connected to select gate drain line SGD), and another terminal is connected to a common source line c-source via a second select (connected to select gate source line SGS). In each block of this example, there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. In this example, 532 bytes of data can be read or programmed simultaneously and forms a logical page. Therefore, one block can store at least eight pages. When each memory cell stores two bits of data, a block would store 16 pages. Other sized blocks and pages can also be used, and architectures other than those of FIGS. 1-3 can be used in accordance with the present disclosure.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

FIG. 4 illustrates a memory device 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In the embodiment of FIG. 4, access to the memory array 100 by the various peripheral circuits is implemented in a symmetric fashion, on opposite sides of the array, so that the densities of access lines and circuitry on each side are reduced by half. In other embodiments, the various peripheral circuits may be provided in a non-symmetric fashion on single sides of the array. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations.

Figure 5:
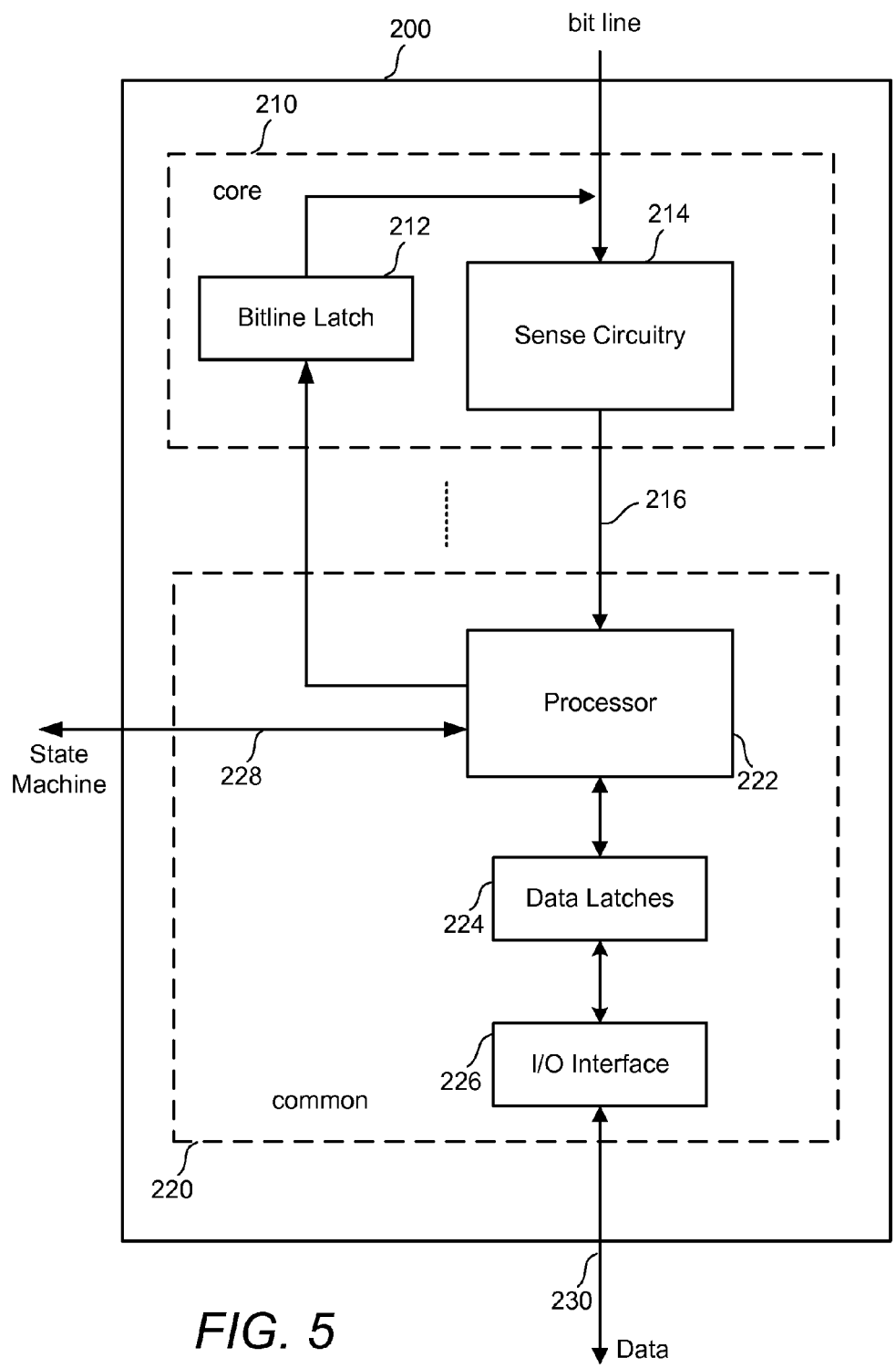
FIG. 5 is a block diagram of a sense block in accordance with one embodiment.

FIG. 5 is a block diagram of an individual sense block 200 partitioned into a core portion, referred to as a sense module 210, and a common portion 220. In one embodiment, there is a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 216. For further details refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 210 comprises sense circuitry 214 that determines whether a conduction current in a connected bit line is above or below a predetermined threshold level. Sense module 210 also includes a bit line latch 212 that is used to set a voltage condition on the connected bit line. For example, a predetermined state latched in bit line latch 212 will result in the connected bit line being pulled to a state designating program inhibit (e.g., $V_{DD}$).

Common portion 220 comprises a processor 222, a set of data latches 224 and an I/O Interface 226 coupled between the set of data latches 224 and data bus 230. Processor 222 performs computations. For example, one of its functions is to determine the data stored in the sensed memory cell and store the determined data in the set of data latches. The set of data latches 224 is used to store data bits determined by processor 222 during a read operation. It is also used to store data bits imported from the data bus 230 during a program operation. The imported data bits represent write data meant to be programmed into the memory. Data read from a cell is stored in the set of data latches before being combined with additional data and sent to the controller via I/O interface 226.

During read or sensing, the operation of the system is under the control of state machine 122 that controls the supply of different control gate voltages to the addressed cell. As it steps through the various predefined control gate voltages corresponding to the various memory states supported by the memory, the sense module 210 may trip at one of these voltages and an output will be provided from sense module 210 to processor 222 via bus 216. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 212 serves double duty, both as a latch for latching the output of the sense module 210 and also as a bit line latch as described above.

During program or verify, the data to be programmed is stored in the set of data latches 224 from the data bus 230. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 212 so as to cause the bit line to be pulled to a state designating program inhibit. This inhibits the cell coupled to the bit line from further programming even if programming pulses appear on its control gate. In other embodiments the processor initially loads the bit line latch 212 and the sense circuitry sets it to an inhibit value during the verify process.

Data latch stack 224 contains a stack of data latches corresponding to the sense module. In one embodiment, there are at least four data latches per sense module 210 to store four bits of data for/from a cell. In some implementations (but not required), the data latches are implemented as a shift register so that the parallel data stored therein is converted to serial data for data bus 230, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

FIG. 6 is a graph depicting exemplary threshold voltage distributions for a group of memory cells when each memory cell stores four bits of data. Sixteen distinct threshold voltage ranges define sixteen memory states denoted 0-15. A first threshold voltage distribution is designated state 0 and includes erased memory cells having a threshold voltage less than 0V. The remaining threshold voltage distributions are designated states 1-15 and include memory cells programmed to within one of the threshold voltage ranges. In some embodiments, additional ones of states 1-15 may also correspond to negative threshold voltage ranges. For example, some implementations may adjust the source and body bias when at the lower states to provide positive voltage operating ranges.

Each distinct threshold voltage range of FIG. 6 corresponds to predetermined values for the set of data bits. The specific relationship between the data programmed into a memory cell and the corresponding threshold voltage level of the cell depends upon the adopted data encoding scheme. For instance, data values are often assigned to the different threshold voltage ranges using a gray code assignment so that if the threshold voltage of a floating gate erroneously shifts to a neighboring physical state, only one bit will be affected. In other embodiments, however, gray coding is not used. FIG. 6 sets forth one example for assigning data bits to the different threshold voltage ranges when each memory cell stores 4 bits of data. In FIG. 6, the different bits are uniquely identified as top, higher, upper, or lower, where the lower bit is the most significant bit and the top bit is the least significant bit. This designation is exemplary only. Furthermore, while FIG. 6 shows 16 states, other structures and arrangements, including those that include more or less than four states, can be used in accordance with the present disclosure.

The encoded data bits corresponding to each state are set forth below the graph of distributions. State 0 stores a 1 for each bit position, including the top, higher, upper and lower bits. State 1 stores a 0 for the top bit position and a 1 in each remaining bit position. As mentioned previously, the data bits represented by the programming state of a storage element can be considered as a code word. With sixteen states for example, a four bit code word can be used.

When reading non-volatile memory, at least one reference threshold voltage level is generally established between each state so as to partition the threshold voltage memory window of the memory cell into the number of ranges used. The threshold voltage of a cell can be compared to the various reference levels, also referred to as compare points, to determine the memory state of the cell. Predetermined, fixed voltages (e.g., read reference voltages) that correspond to the reference threshold voltage levels can be applied to a cell's gate, and its source/drain conduction state established by comparing the conduction with a breakpoint level or reference current.

FIG. 6 shows fifteen read compare points V1-V15 for reading data from the memory cells. By testing whether the threshold voltage of a given memory cell is above or below the various compare points, the system can determine what state the memory cell is in. If a memory cell conducts with V1 applied to its control gate, then the memory cell is in state 0. If a memory cell conducts at V2 but not at V1, then the memory cell is in state 1. If the memory cell conducts at V3 but not at V2, then the memory cell is in state 2. If the memory cell conducts at V4 but not at V3, then the memory cell is in state 3. If the memory cell conducts at V5 but not at V4, then the memory cell is in state 3. If the memory cell conducts at V6 but not at V5, then the memory cell is in state 5. If the memory cell conducts at V7 but not at V6, then the memory cell is in state 6. If the memory cell conducts at V8 but not at V7, then the memory cell is in state 7. If the memory cell conducts at V9 but not at V8, then the memory cell is in state 8. If the memory cell conducts at V10 but not at V9, then the memory cell is in state 9. If the memory cell conducts at V11 but not at V10, then the memory cell is in state 10. If the memory cell conducts at V12 but not at V11, then the memory cell is in state 11. If the memory cell conducts at V13 but not at V12, then the memory cell is in state 12. If the memory cell conducts at V14 but not at V13, then the memory cell is in state 13. If the memory cell conducts at V15 but not at V14, then the memory cell is in state 14. If the memory cell does not conduct at any of the compare voltage levels, the memory cell is in state 15.

FIG. 6 also shows fifteen verify compare points Vv1-Vv15. When programming memory cells to state 1, the system tests whether those memory cells have a threshold voltage greater than or equal to Vv1. When programming memory cells to state 2, the system tests whether the memory cells have threshold voltages greater than or equal to Vv2, etc.

Figure 7:
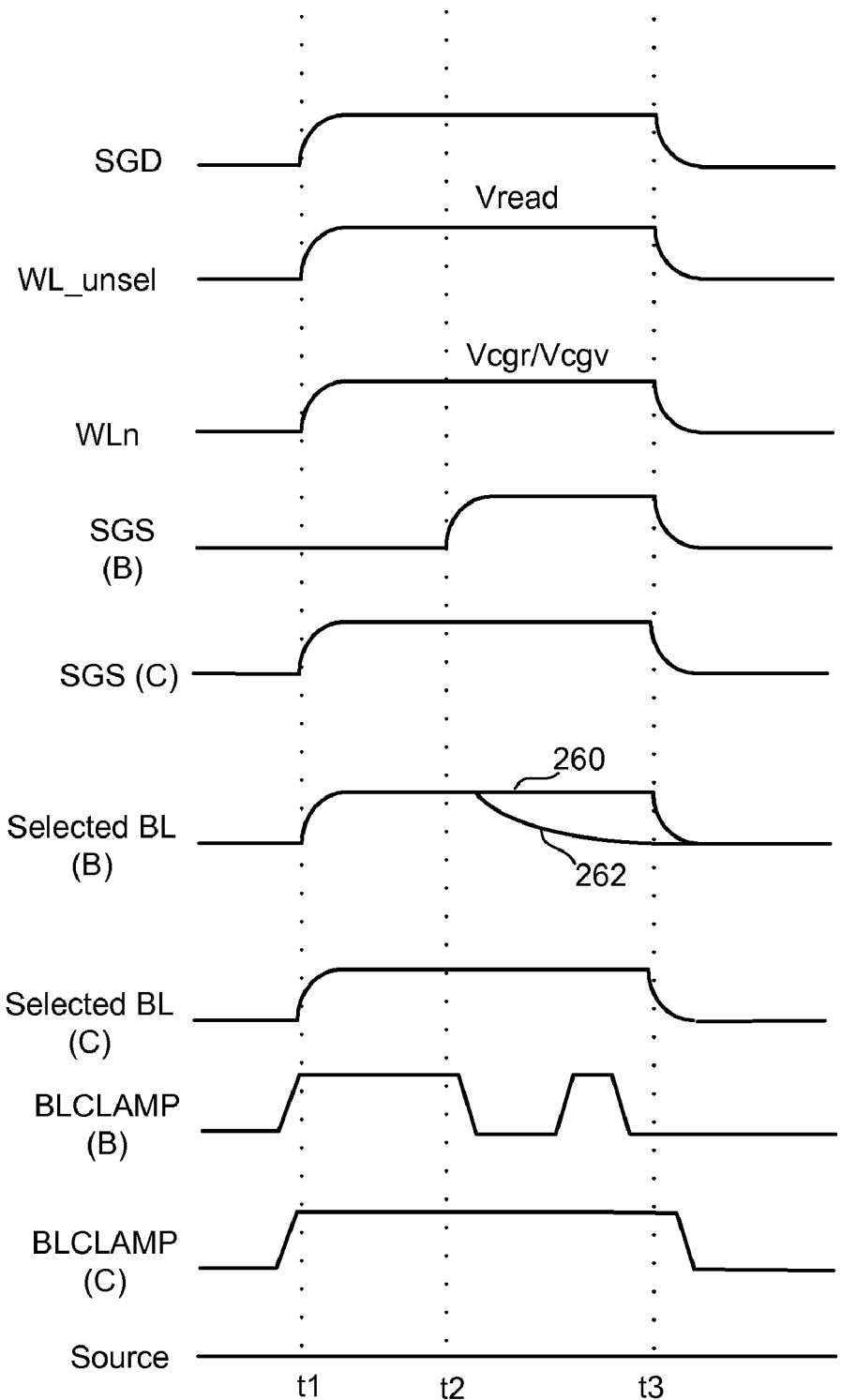
FIG. 7 is a timing diagram that explains the behavior of certain signals during read/verify operations.

FIG. 7 is a timing diagram depicting the behavior of various signals during one iteration of an exemplary read or verify process. Each iteration of the process of FIG. 7 represents a single sense operation for each cell memory. If the memory cells are binary memory cells, the process of FIG. 7 may be performed once. If the memory cells are multi-state memory cells with four states (e.g., 0, 1, 2, and 3), the process may be performed three times (three sense operations) for each memory cell (generally in parallel).

During read and verify operations the selected word line (e.g., WL2 of FIG. 3) is typically connected to a read reference voltage Vcgr, a level of which is specified for each read and verify operation in order to determine whether a threshold voltage of the concerned memory cell has reached such level. The select gates of a selected block are raised to one or more select voltages and the unselected word lines (e.g., WL0, WL1 and WL3 of FIG. 3) of the selected block are raised to a read pass voltage Vread (e.g., 4.5 volts) to make the transistors operate as pass gates. After applying the word line voltage, the conduction current of the memory cell is measured to determine whether the memory cell turned on in response to the voltage applied to the word line. If the conduction current is measured to be greater than a particular value, then it is assumed that the memory cell turned on and the voltage applied to the word line is greater than the threshold voltage of the memory cell. If the conduction current is not measured to be greater than the particular value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not.

FIG. 7 shows signals SGD, WL_unsel. WLn+1, WLn, SGS, Selected BL, BLCLAMP, and Source starting at Vss (approximately 0 volts). SGD is the gate selection line of the drain side select gate. SGS is the gate selection line of the source side select gate. WLn is the word line selected for reading/verification. WLn+1 is the unselected word line that is the drain side neighboring word line to WLn. WL_unsel represents the unselected word lines other than the drain side neighboring word line. Selected BL is the bit line selected for reading/verification. Source is the source line for the memory cells (see FIG. 3). BLCLAMP is an analog signal that sets the value of the bit line when charged from the sense amplifier.

In FIG. 7, the sensing circuits measure the conduction current of a memory cell by determining whether the bit line has discharged. At time t1, SGD is raised to $V_{DD}$ (e.g., approximately 3.5 volts), the unselected word lines (WL_unsel) are raised to Vread (e.g., approximately 5.5 volts), the selected word line WLn is raised to Vcgr (e.g., V1, V2 . . . V15) for a read operation or a verify level Vcgv (e.g., Vv1, Vv2 . . . Vv15) for a verify operation, and BLCLAMP is raised to a pre-charging voltage to pre-charge the selected bit line Selected BL (e.g., to approximately 0.7V). The voltage Vread acts as a pass voltage, causing the unselected memory cells to turn on regardless of physical state or threshold voltage and act as pass gates. At time t2, BLCLAMP is lowered to Vss so the NAND string can control the bit line. Also at time t2, the source side select gate is turned on by raising SGS to $V_{DD}$. This provides a path to dissipate the charge on the bit line. If the threshold voltage of the memory cell selected for reading is greater than Vcgr or Vcgv applied to the selected word line WLn, then the selected memory cell will not turn on and the bit line will not discharge, as depicted by signal line 260. If the threshold voltage in the memory cell selected for reading is below Vcgr or Vcgv applied to the selected word line WLn, then the memory cell selected for reading will turn on (conduct) and the bit line voltage will dissipate, as depicted by curve 262. At some point after time t2 and prior to time t3 (as determined by the particular implementation), the sense amplifier will determine whether the bit line has dissipated a sufficient amount. In between t2 and t3, BLCLAMP (B) is raised to let the sense amplifier measure the evaluated BL voltage and then lowered. At time t3, the depicted signals will be lowered to Vss (or another value for standby or recovery). Note that in other embodiments, the timing of some of the signals can be changed (e.g. shift the signal applied to the neighbor).

FIG. 8 is a flow chart describing one embodiment for reading data from non-volatile memory cells. FIG. 8 provides the read process at the system level. At step 300, a request to read data is received. At step 302, a read operation is performed for a particular page in response to the request to read data. In one embodiment, when data for a page is programmed, the system will also create extra bits used for Error Correction Codes (ECCs) and write those ECC bits along with the page of data. When reading data from a page, the ECC bits will be used to determine whether there are any errors in the data at step 304. The ECC process can be performed by the controller, the state machine or elsewhere in the system. If there are no errors in the data, the data is reported to the user at step 306. If an error is found at step 304, it is determined whether the error is correctable at step 308. The error may be due to floating gate to floating gate coupling or other reasons. Various ECC methods have the ability to correct a predetermined number of errors in a set of data. If the ECC process can correct the data, then the ECC process is used to correct that data at step 310 and the data, as corrected, is reported to the user at step 312. If the data is not correctable by the ECC process, a data recovery process may be performed at step 314. In some embodiments, an ECC process will be performed after step 314. After the data is recovered, that data is reported to the host at step 316. The process can continue by reading additional pages if necessary while reporting data to the host.

Figure 9:
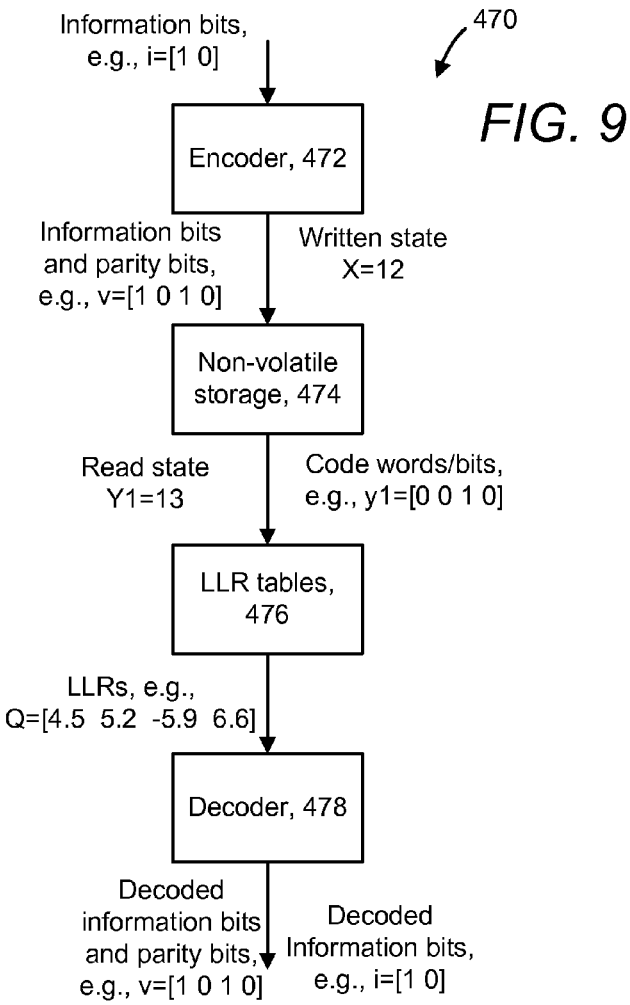
FIG. 9 is a block diagram of an error correction control system in accordance with one embodiment.

FIG. 9 depicts a system for encoding and decoding data for non-volatile storage that can be used in accordance with one embodiment. Error correction controls are employed to detect and correct readings of erroneous or corrupted data in the non-volatile memory array. Generally speaking, some additional ECC or parity bits are calculated from the input data and stored in the memory array according to an encoding scheme. When reading, the input data and ECC bits are both read, and a decoder uses both to detect whether errors are present and in some cases, in which bit(s) the errors occur.

The error correction control system of FIG. 9 can be implemented as part of controller 144 in one embodiment, although different systems and architectures can be used. The system of FIG. 9 includes an encoder 472, memory array 474, LLR (logarithmic likelihood ratio) tables 476 and a decoder 478. The encoder 472 receives user data, also referred to as information bits, that is to be stored in memory array 474. The informational bits are represented by the matrix i=[1 0]. The encoder 402 implements an error correction coding process in which parity bits are added to the informational bits to provide data represented by the matrix or code word v=[1 0 1 0], indicating that two parity bits have been appended to the data bits. Other techniques, such as those discussed hereinafter, can be used that map input data to output data in more complex manners. Low density parity check (LDPC) codes, also referred to as Gallager codes, can be used. In practice, such codes are typically applied to multiple pages encoded across a number of storage elements. Further information regarding LDPCs can be found in D. MacKay, Information Theory, Inference and Learning Algorithms, Cambridge University Press 2003, chapter 47. The data bits can then be mapped to a logical page and stored in the non-volatile storage 474 by programming a non-volatile storage element to a programming state, e.g., X=12, which corresponds to v. With a four-bit data matrix v, sixteen programming states can be used. Generally, parity bits are not used for each individual cell.

In one possible implementation, an iterative probabilistic decoding process is used which implements error correction decoding corresponding to the encoding implemented at the encoder 472. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables 476. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the read state is Y, and P(v=1|Y) is the probability that a bit is a 1 given the condition that the read state is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the four bit positions in the codeword y1. For example, LLRs of 4.5, 5.2, −5.9 and 6.6 are assigned to bits 0, 0, 1 and 0, respectively, of y1. Further, the LLR tables can account for the multiple read results so that an LLR of greater magnitude is used when the bit value is consistent in the different code words.

The decoder 478 receives the code word y1 and the LLRs. As explained below (see e.g., FIGS. 11 and 12), the decoder 478 iterates in successive iterations in which it determines if parity checks of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of y1 is completed to obtain the decoded information including parity bits v and the decoded information bits i.

Figure 10:
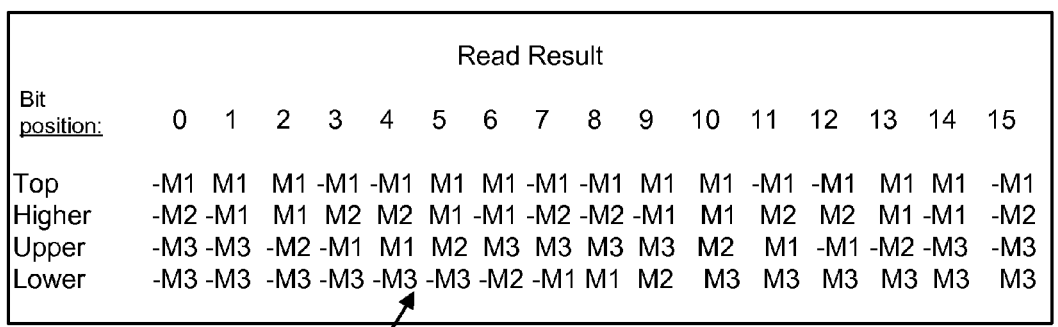
FIG. 10 is a table that provides exemplary initial LLR values for each bit of a code word or unit of data based on a hard read result.

FIG. 10 is a table of initial LLR values for each bit position of the different states for a device as illustrated in FIG. 6 (where M3>M2>M1). A positive LLR value indicates a logical 0 for the corresponding bit and a negative LLR indicates a logical 1 for the corresponding bit. A greater magnitude indicates a greater reliability or probability with respect to the bit being in that logical state. For example, the lower bits in states 0 through 5 have an LLR=−M3, indicating that these bits have a high probability of being a 1. That can be seen intuitively from FIG. 6, since the probability that reading a cell as in state Y1 that is actually in a programmed state far enough away to change the bit from a 0 to a 1 is small. Thus, the LLR for the lower bit for state 5 is −M3 (higher probability of correctness) since the read state would have to be off by at least three states from the programmed state, e.g., state 8 (where the lower bit is 0, not 1). However, the LLR for the lower bit for state 6 is −M2 (intermediate probability of correctness) since the read state would have to be off by two states for the bit to be in error. Similarly, the LLR for the lower bit for state 7 is −M1 (lower probability of correctness) since the read state would have to be off by only one state for the bit to be in error. Similar reasoning applies to the other bit positions. For example, the LLRs for the top bits indicate a relatively low probability of correctness since an error of only one state would result in the bit being incorrect.

Figures 11, 12:
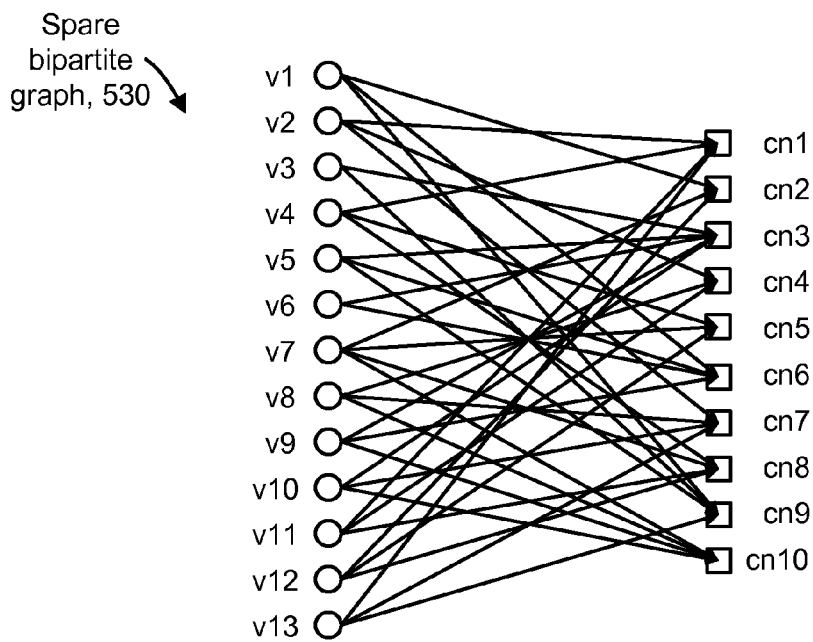
FIG. 11 depicts an exemplary sparse parity check matrix.
FIG. 12 depicts a sparse bipartite graph which corresponds to the sparse parity check matrix of FIG. 11.

FIG. 11 depicts a sparse parity check matrix. As mentioned previously, the memory stores data which represents informational bits and parity bits (or ECC bits), where the parity bits are provided according to an error correction coding process. Such as process involves adding parity bits to information bits. In one possible approach, a low density parity check (LDPC) code may be used. In practice, such codes are typically applied to multiple code words which are encoded across a number of storage elements (i.e., not every cell stores parity bits, the check being distributed across multiple cells). LDPC codes are desirable because they incur a relatively low overhead cost. Moreover, LDPC codes exhibit a performance near the Shannon limit under iterative message-passing decoding algorithms. However, this is an example implementation only, as any types of error correction code can be used as well. For example, other linear block codes may be used.

An LDPC code is a linear block code which is characterized by a sparse parity check matrix, e.g., as depicted by the matrix 520. The matrix includes K information bits and M parity bits, and the code length is N=K+M. Further, the parity bits are defined such that M parity check equations are satisfied, where each row of the matrix represents a parity check equation. In particular, the rows of the matrix are identified by check nodes cn1 through cn10 and the columns are identified by variables v1 through v13, which indicate the data that is stored in the storage elements, e.g., the code word bits. This data includes information bits i and parity bits p, based on the equation:

$$H \cdot \overline{v} = H \cdot \begin{bmatrix} i \\ p \end{bmatrix} = 0,$$

where H is the sparse parity check matrix, v is the data matrix, i is the information bit matrix and p is the parity bit matrix. The data matrix v can be determined by solving the above equation. Further, this can be done efficiently using a Gaussian elimination procedure if the matrix H is lower triangular.

FIG. 12 depicts a sparse bipartite graph which corresponds to the sparse parity check matrix of FIG. 11. The graph 530 indicates in further detail how the LDPC code works. The variable nodes v1 through v13 represent the code word bits and the check nodes cn1 through cn10 represent the parity check constraints on the bits.

During decoding, the decoder attempts to satisfy the parity checks. In this example, there are ten parity checks as indicated by the check nodes cn1 through cn10. For simplicity, the following discussion is provided with respect to binary bits, which can take the values of 0 or 1. For an actual implementation, the bits can be LLR values, where a positive LLR represents binary 1, and a negative LLR represents binary 0. Moreover, instead of using a typical XOR logical operation a "soft XOR" can be used in implementations. A soft XOR operation operates on analog LLR values and returns an analog value. Soft XOR operations on LLR values reduce to logical XOR operations on binary bits, if we reduce positive LLR values to binary 0s and negative LLR values to binary 1s.

The first parity check at cn1 determines if v2⊗v4⊗v11⊗v13=0, where ⊗ denotes the exclusive-or (XOR) logical operation. This check is satisfied if there is an even number of "1" bits in v2, v4, v11 and v13. This check is denoted by the fact that arrows from nodes v2, v4, v11 and v13 point to node cn1 in the graph 1300. The second parity check at cn2 determines if v1⊗v7⊗v12=0, which is satisfied if there is an odd number of "1" bits. The third parity check at cn3 determines if v3⊗v5⊗v6⊗v9⊗v10=0, which is satisfied if there is an odd number of "1" bits. Similarly, the fourth parity check at cn4 determines if v2⊗v8⊗v11=0, the fifth parity check at cn5 determines if v4⊗v7⊗v12=0, the sixth parity check at cn6 determines if v1⊗v5⊗v6⊗v9=0, the seventh parity check at cn7 determines if v2⊗v8⊗v10⊗v13=0, the eighth parity check at cn8 determines if v4⊗v7⊗v11⊗v12=0, the ninth parity check at cn9 determines if v1⊗v3⊗v5⊗v13=0 and the tenth parity check at cn01 determines if v7⊗v8⊗v9⊗v10=0.

The decoding process for LDPC is an iterative probabilistic decoding process known as iterative message passing decoding. Iterating involves serially traversing the check nodes and updating the LLR values of the bits involved based on each parity check. In one approach, an attempt is made to satisfy the first parity check of cn1. Once that parity check is satisfied, an attempt is made to satisfy the first parity check of cn2 and so forth. In another embodiment, after an unsuccessful attempt at cn1, the process moves to cn2 and comes back to cn1. The LLR values are adjusted, if necessary, for each iteration in a manner known to those skilled in the art. This iterative algorithm is a form of belief propagation.

To improve convergence times, higher order bit level information can be obtained from the memory cells during the error correction control process. The additional information may be referred to as "soft bits" and the corresponding operations referred to as soft bit read operations at soft bit compare points. "Soft bits" are collected by reading the memory cells at adjusted compare levels to provide more data that can be used by the correction engine to speed up or otherwise aid the convergence process. For example, each of the compare points used during the normal "hard" read operation can be incremented by 0.5V to provide soft bit compare levels in one embodiment. By reading at soft bit comparison levels, more data is made available to the error correction control process which can improve convergence performance.

Figures 13, 14, 15:
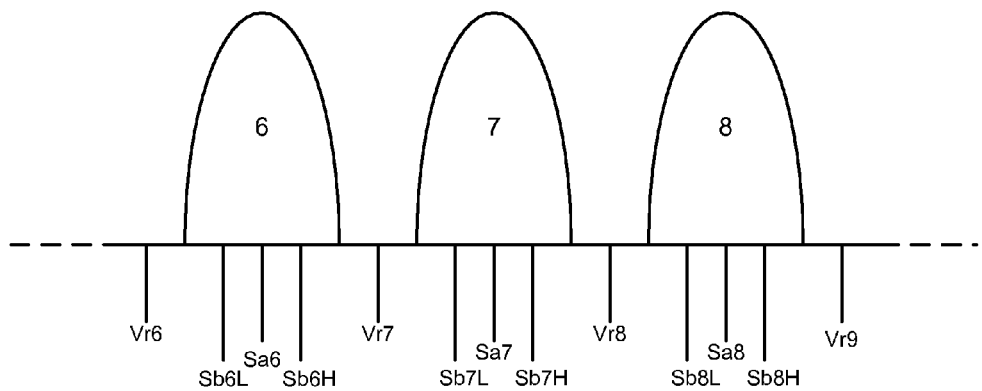
FIG. 13 is a graph of a portion of the threshold voltage distributions of FIG. 6 illustrating soft bit compare levels.
FIG. 14 is a table that provides exemplary initial LLR values for each bit of a code word or unit of data based on a hard read result and a first soft bit read result.
FIG. 15 is a table that provides exemplary initial LLR values for each bit of a code word or unit of data based on a hard read result, a first soft bit read result and a second soft bit read result.

FIG. 13 illustrates the use of soft data bits in accordance with one embodiment as part of an error correction control process. States 6, 7, and 8 of the sixteen state device shown in FIG. 6 are shown. Only a portion of the overall threshold voltage distributions are depicted for clarity. The normal or "hard bit" read compare points V6, V7, V8 and V9 are depicted along with various soft bit read compare levels. A first soft bit is determined for each cell by reading at a first set of soft bit read levels Sa6, Sa7, and Sa8. These compare points bisect their corresponding threshold distributions. These bisection points may happen to occur at the peaks of the distributions, though this may not necessarily be the case for different memory devices. In other embodiments, the read levels may be placed at different locations. Similar reference levels would also be provided at each other state as shown in FIG. 6. A read operation is performed using the adjusted compare levels and the data reported to the controller to be used as part of the error correction control process.

The first soft bit divides each threshold voltage distribution in two to further partition the information known for each cell. The soft bit increases the resolution with which the state of any individual memory cell is known by specifying where in the distribution it may lie. For instance, a cell that is conductive at the soft bit read level Sa7 but not Sa6, can be reported to the controller using the encoding for state 6. If such a cell was previously read as in state 6, the controller can determine that it lies within the upper half of the voltage distribution for state 6.

A second soft bit is determined for each cell by reading at a second set of read levels. FIG. 13 depicts second soft bit levels Sb6L, Sb6H, Sb7L, Sb7H, Sb8L, and Sb8H. The second soft bit levels are positioned between the first soft bit levels and the hard bit compare levels. The lower levels (e.g., Sb6L) for the second soft bit are positioned between the first soft bit compare level (e.g., Sa6) and the corresponding hard compare level (e.g., V6). The higher levels are positioned between the first soft bit level and the hard compare level. Similar reference levels would also be provided at each other state as shown in FIG. 6. A read operation is performed using each of the adjusted compare levels and the data reported to the controller to be used for correction control.

The second soft bit at each state level is divided into two partial soft bits. There are two compare points for each state for the second soft bit as illustrated in FIG. 6. The first partial soft bit is determined using a first subset of compare levels (including one level per state) and the second partial soft bit is determined using a second subset of compare levels (including one level per state). Because the memory array may be configured to read at a four bit resolution, the compare points of the two subsets are applied at distinct intervals. In a device utilizing sixteen states, data can be read from each cell at a four bit resolution. Data is provided between the memory array and controller at this resolution in most instances. For example, a host may issue a request for one or more pages to the controller. The memory array may provide one page of data at a time to the controller while reading the next requested page. To accommodate reading at two compare levels for each state for the second soft bit, the compare levels are divided into two subsets. For example, the first subset could include the lower compare levels (e.g., Sb6L, Sb7L, etc.) and the second subset could include the higher compare levels (e.g., Sb6H, Sb7H, etc.). The memory can read at the first set of levels and report the data to the controller at the four bit resolution and then read at the second set of levels and report that data to the controller at the four bit resolution. The controller can use the data from the two subsets of second soft bit levels to divide each memory cell's state determination to within a quartile of the state. The data can be used with the information from the hard compare levels and the first soft bit to provide a high level of resolution.

A table of initial LLR values that incorporates the first soft bit data is depicted in FIG. 14. FIG. 14 only includes that portion of the table corresponding to states 6, 7, and 8 as shown in FIG. 13. A complete table for a sixteen state device would include two columns for every state. The first soft bit LLR table includes twice as many entries as the table of LLR values that is accessed after the hard bit read. Reading at the first soft bit compare levels determines each memory cell's threshold voltage relative to the adjusted compare points. By combining the data from the hard bit read with the data from the first soft data bit read, the controller can determine within which half of the corresponding state distribution a memory cell lies.

The table includes two columns for each state, each column representing one half of the corresponding distribution. For example, column 6(0) corresponds to those memory cells in the lower half of the state 6 distribution while column 6(1) corresponds to those memory cells in the upper half of the state 6 distribution. Similarly, column 7(0) corresponds to those memory cells in the lower half of the state 7 distribution, column 7(1) corresponds to those memory cells in the upper half of the state 7 distribution, column 8(0) corresponds to those memory cells in the lower half of the state 8 distribution, and column 8(1) corresponds to those memory cells in the upper half of the state 8 distribution. Each column includes an LLR value that in this embodiment, is shown as an adjustment to the LLR values from the hard bit LLR values of FIG. 10. The LLR values in each column reflect an increased or decreased certainty in a bit's value based on the additional information from the first soft bit. In other embodiments, the LLR values can be defined in different terms, such as in absolute measures rather than adjustments to the hard bit data LLR values.

A table of initial LLR values that incorporates the second soft bit data is depicted in FIG. 15. Again, the table only includes that portion of the table corresponding to states 6, 7, and 8 as shown in FIG. 9 for purposes of clarity. Furthermore, the table only lists the adjustment itself that would be made to the LLR value depicted in FIG. 10 to save space in the table. As with the values in FIG. 14, it is possible to define the new LLR values in different terms, such as absolutes rather than adjustments to the hard data LLR values. A complete table for a sixteen state device would include four columns for every state. The second soft bit table includes four columns for each state, each column representing one quarter of the state's corresponding distribution. For example, column 6(00) represents those memory cells in the lowest quarter of the state 6 distribution, column 6(01) represents those memory cells in the second lowest quarter of the state 6 distribution, column 6(10) represents those memory cells in the second highest quarter of the state 6 distribution, and column 6(11) represents those memory cells in the highest quarter of the state 6 distribution. Similar columns are provided for states 7 and 8, with the designations 00, 01, 10, 11 used to identify cells in the lowest, second lowest, second highest, and highest quartile region of the corresponding distribution.

In accordance with one embodiment, an additional LLR table is provided for iterative decoding based on the data from the first partial soft bit of the second soft bit operation before the second partial soft bit data for the second soft bit is received. In this manner, the additional information from the first subset of compare levels for the second soft bit can be acted upon prior to completing reading for the second subset of compare levels. In some instances, the decoding process may converge prior to second partial soft bit read completing, thus decreasing the overall time for reading.

A table of initial LLR values incorporating data from a first subset of second soft bit compare levels according to one embodiment is depicted in FIG. 16. That portion of the table corresponding to states 6, 7, and 8 as shown in FIG. 6 is again depicted. A complete table for a sixteen state device would include columns corresponding to every state (3 columns for each state). Again, the LLR values are described in relative terms to the hard bit LLR values but can be defined in different manners, such as by non-relative numbers, etc.

As described above, the set of compare levels for the second soft bit read is divided into two sets to accommodate reading at two compare levels for each state. This enables the memory to operate under normal read conditions whereby four bits of data per cell is transferred between the memory and controller. Or course, other implementations, such as those with a different number of states, may require different numbers of compare levels. An example was earlier described where a first subset of reads is performed at the lower compare levels, followed by a second subset at the higher compare levels. In FIG. 16, the lower and upper levels are chosen based on the characteristics of each individual state. A division as earlier described could also be used in other embodiments. The first subset of compare levels for the second soft bit read includes Sb6L for state 6, Sb7H for state 7, and Sb8L for state 8. The second subset includes Sb6H, Sb7L, and Sb8H. In this example, the first subset of levels might include the lower levels because those state distributions were determined to drift in the negative threshold voltage direction while state 7 was determined to drift in the positive direction. Any number and types of divisions for the compare levels of the second soft bit can be used in accordance with various embodiments. It should be noted that the disclosed principles can be extended to even higher levels of soft bit reading.

For state 6, the 6(00) column corresponds to cells in the lowest quarter of the threshold voltage range for state 6. The 6(01) column corresponds to cells in the second lowest quarter, and the 6(1) column corresponds to all of the cells in the upper half of the threshold voltage range of state 6. Individual columns for the quarters corresponding to the upper half of the threshold voltage distribution for state 6 are not provided. The Sb6H level which provides the differentiation for that information will be performed with the second partial soft bit operation. For state 7, the 7(0) column corresponds to all the cells in the lower half of the threshold distribution for state 7, the 7(01) column corresponds to the cells in the lower quarter of the upper half of the state 7 distribution, and the 7(11) column corresponds to the cells in the highest quarter of the state 7 distribution. Individual columns are not provided for the lower quarters of the state 7 distribution because the Sb7H compare level was applied in the first subset. For state 8, the 8(00) column corresponds to the cells in the lowest quarter of the threshold voltage range for state 8. The 8(01) column corresponds to the cells in the second lowest quarter and the 8(1) column corresponds to all of the cells in the upper half of the threshold voltage range for state 8. Individual columns for the quarters corresponding to the upper half of the threshold voltage distribution for state 8 are not provided because a read operation at Vb8H has not yet been performed.

The LLR values in the table of FIG. 16 indicate increased or decreased reliability with respect to the individual bits of a cell based on the additional data gathered from the first partial soft bit of the second soft bit read operation. For instance, the LLR value for the top bit in the 6(00) column is M1+7, rather than M1+5 as provided for the 6(0) column in the first soft bit LLR table. If a cell is determined to lie in the lower part of the lower half of the state 6 distribution, the top bit can be considered even more reliable since the adjacent state in that direction has the same logical value for the top bit. The LLR value for the top bit in the 6(01) column is M1+5, the same as provided for the 6(0) column in the first soft bit table. This indicates no further reliability with respect to the top bit's value. The LLR value can be increased (e.g., to M1+6) over the first soft bit value for the 6(0) column, however, to indicate increased reliability in another embodiment based on again reading the cell as within state 6 for example. In one embodiment, the LLR value can be decreased if it's desired to indicate a decreased reliability based on being in the upper quarter of the lower half.

Figure 17A:
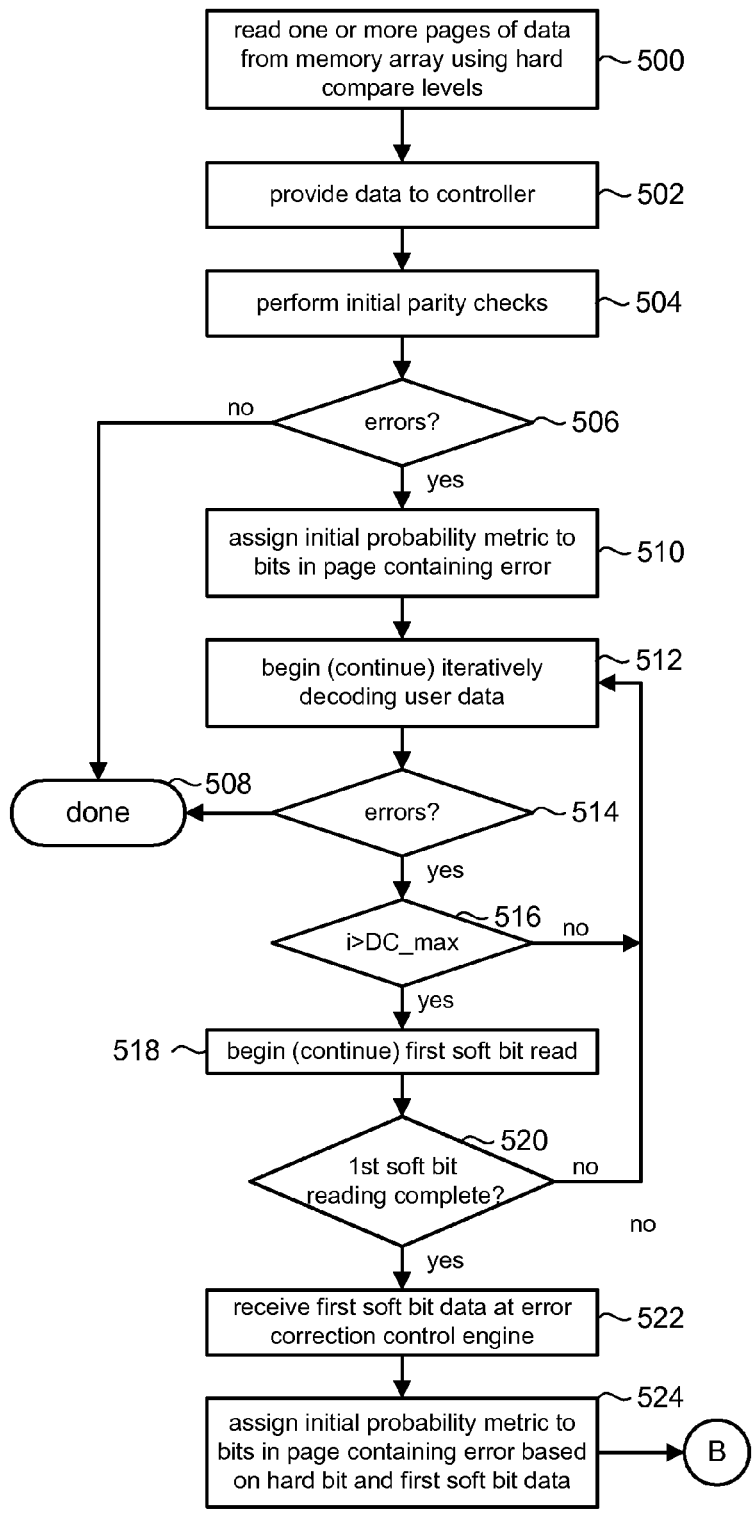
FIGS. 17A-17B contain a flowchart describing a process for providing error correction control that includes acting on partial soft bit data.
Figure 17B:
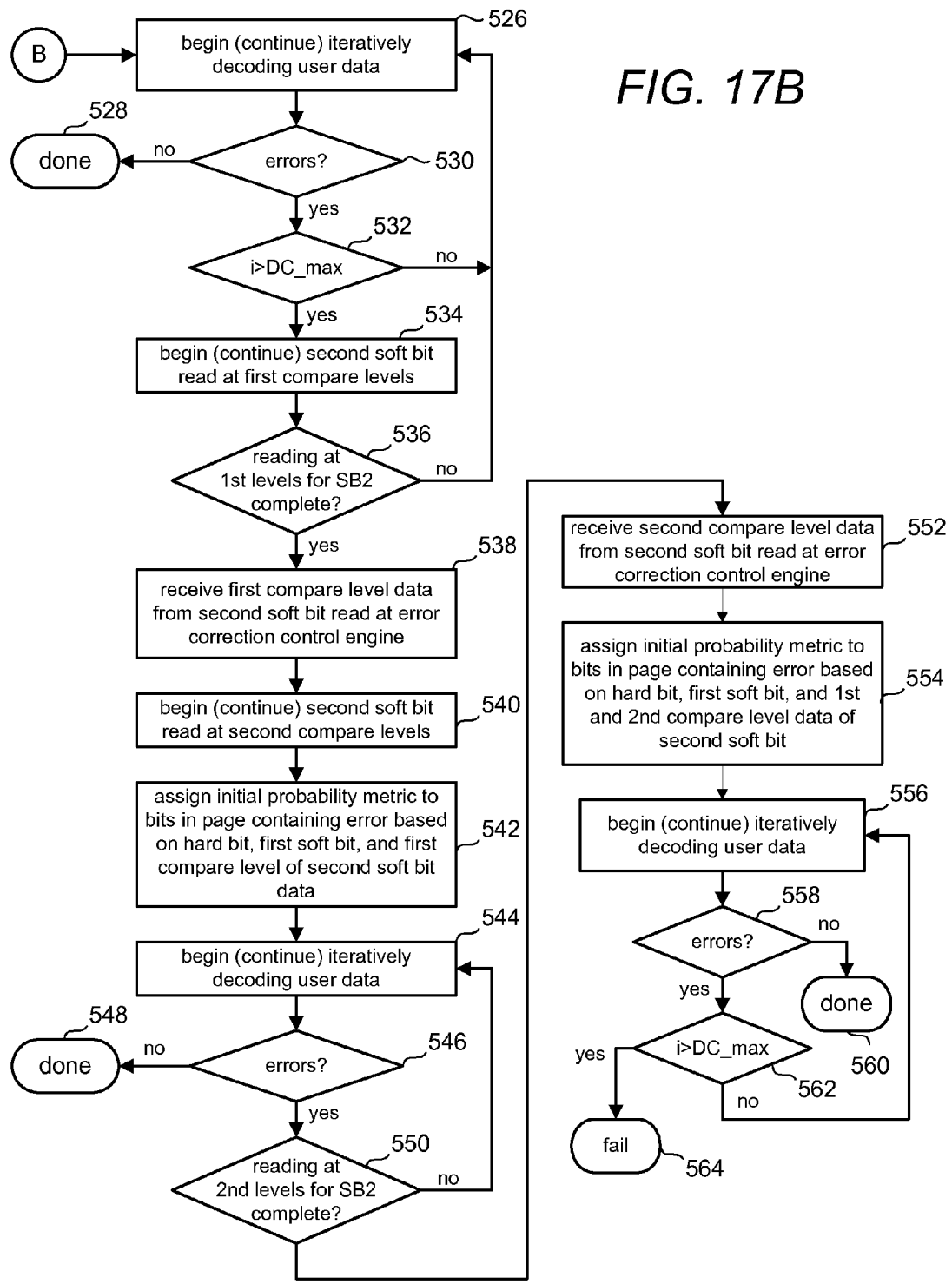

FIGS. 17A and 17B depict a flowchart describing a method for reading non-volatile storage in accordance with one embodiment. The described reading technique includes iterative decoding using LLR values as part of an error correction control process. A first table of initial LLR values is used to decode the data based on reading at the hard compare levels. Reading first and second soft bit data from the memory is also provided to improve convergence. A second table of initial LLR values is used to decode the data based on reading at the hard compare levels and the first soft bit levels. A third table of initial LLR values is used to decode the data based on reading at the hard compare levels, the first soft bit levels, and a first subset of the second soft bit compare levels. A fourth table of initial LLR values is used to decode the data based on reading at the hard compare levels, the first soft bit levels, the first subset of the second soft bit compare levels, and the second subset of the second soft bit compare levels.

At step 500, one or more pages of data are read from the memory array using the hard read compare levels to distinguish between the multiple states to which the cells may be programmed. Other units of data can be read in accordance with the disclosed principles. By way of example, a page of data might include each of the four bits from each cell of a group of cells. Other examples of pages might include a particular bit from each cell of a group of cells. Cells might be grouped according to word line or by word line and type of word line, for example. Depending on the nature of the operation performed at step 500 and the adopted encoding scheme, various hard compare levels can be applied. For instance, reading every bit from the cells might entail application of each compare level while reading the lower bit might be accomplished simply by applying the V8 compare level. At step 502, the data for the unit that was read is provided from the memory chip to the controller. For example, sequential pages of data are provided in one embodiment. At step 504, the data is decoded according to the encoding technique used when writing the data. For example, step 504 can include performing one or more parity checks on the data. If no errors are detected at step 506, the read operation completes at step 508. If one or more errors are detected however, error correction begins for the data in error at step 510. Error correction can be performed for various portions of the data that is read in step 500. Depending on the level at which the correction scheme can identify an error in the data, different sizes of data can undergo iterative probabilistic decoding.

An initial probability metric is assigned to each of the bits in each unit of data in which an error was detected at step 510. For example, a metric may be assigned to each bit in a number of error correction pages having a detected error. The metric assigned to each bit is an initial LLR value determined from a first LLR table in one embodiment. At step 512, iterative decoding of the data begins. The parity at a first check node can be assessed and the initial LLR values adjusted if parity is not met. The process can continue to a second check node if necessary and parity checked. As earlier described, the parity of select bits eventually change during the iterative process resulting in parity. So long as errors continue to be detected in at least one unit of data at step 514, and a counter i has not exceeded a maximum number of iterations DC_max as determined at step 516, the iterative decoding process continues at step 512. If all the errors are corrected, the read operation completes at step 508.

If all the errors aren't eventually corrected, a first soft bit read operation begins at step 518. The first soft bit read can apply an adjusted set of compare levels to provide a higher resolution decoding of the data. As shown in FIG. 6 for example, a single read compare point for each state that bisects the state's corresponding threshold voltage distribution can be applied. While reading the first soft bit, iterative decoding of the data based on the initial LLR values continues. This is indicated by the check at 520.

When reading the first soft bit completes at step 520, the data is received at the controller at step 522. The newly received data can be used with the data received during the hard read operation to double the resolution by which the threshold voltage of the cell is known. For instance, the controller can determine in which half of a distribution a cell lies if the soft bit read is performed at the middle point of the distribution. Using the data gathered by the hard and soft data reads, the controller can assign a new initial LLR value to each bit in the units of data containing errors. In one embodiment, step 524 includes accessing a second table of initial LLR values. This table can include twice as many entries as the first table to provide LLR values that depend not only on the state of the cell, but also on which half of the state's distribution the cell is within.

Iteratively decoding the data using the new starting LLR values begins at step 526 in FIG. 13B. The LLR values can be adjusted iteratively according to one or more check nodes or parity checks as earlier described. If the data in error is corrected, the operation completes at step 528. So long as there continue to be errors and a counter i is below a maximum number of iterations DC_max, the iterative decoding process continues, attempting to reach parity at each check node. The maximum number of iterations DC_max permitted at step 532 may or may not be the same as that used at step 516. Additionally, the counter may be reset after beginning the first soft bit read.

When the maximum number of iterations is reached, reading at the first partial soft bit compare levels begins at step 536. As earlier described, the second soft bit operation provides double the resolution as the first soft bit and hard level reads. Two compare points are used for each state. The compare levels are divided into two subsets to provide the data from the chip to the controller in two separate units. While reading at the first subset of compare levels is performed, the iterative decoding process based on the hard compare levels and the first soft bit compare levels continues (step 526) in the hope that the process will converge before acquiring the second soft bit data. If all the errors are not corrected and the first subset of reads for the second soft bit completes, the data from the first subset of the second soft bit is received by the controller at step 538. In the embodiment of FIGS. 17A-17B, reading at the second subset of levels for the second soft bit begins at step 540 after receiving the data for the first subset of levels. In other embodiments, a number of iterations of decoding after receiving the first subset of data can be performed before initiating reading at the second subset of levels.

At step 542, an initial probability metric is assigned to each bit in the pages containing errors based on the hard compare level data, the first soft compare level data, and the first subset of the second soft bit compare level data. The iterative decoding process begins again at step 544. At step 546, one or more error checks are performed. If no errors are detected, the read operation completes at step 548. If errors remain and the second subset of reads for the second soft read operation have not completed, the iterative decoding process continues at step 544. Once reading at the second subset of second soft bit levels completes, the data from the second subset of reads is received at the controller at step 552. An initial probability metric is again assigned at step 554 to each bit in the error containing units of data. The metrics assigned at step 554 are based on the data from the hard compare level reading, the first soft bit data, and both subsets of the second soft bit data. For instance, one embodiment includes accessing a table of initial LLR values that includes, for every potential state, four initial LLR values for every bit position based on four different quartiles of the threshold voltage distribution within which a cell may lay. A table such as that described in FIG. 15 is accessed in one embodiment to determine the initial LLR values to use in decoding the user data.

Iterative decoding of the user data begins at step 556 based on the new initial LLR values. The values are adjusted as the decoding process continues, with certain bit positions eventually switching parity. If the errors are all corrected as determined at step 558, the read operation completes at step 560. If the errors are not all corrected and maximum number of iterations have been performed as determined at step 562, a read failure is determined at step 564.

Figures 18, 19:
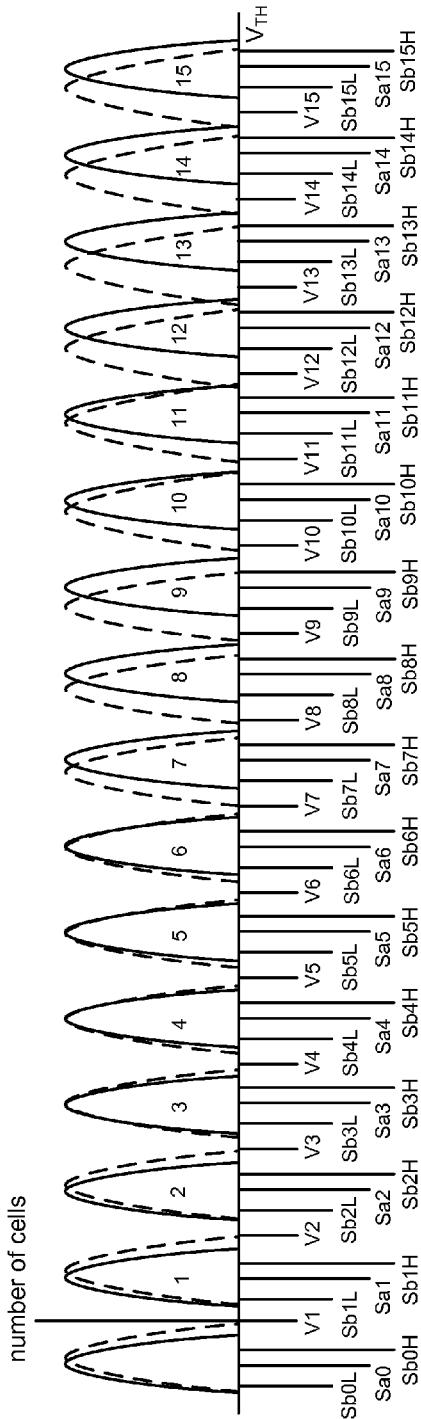
FIG. 18 is a graph of exemplary distributions of threshold voltages for a four-bit memory system, including a representation of the distributions after shifts in threshold voltage.
FIG. 19 is a table containing an exemplary intelligent partitioning of a first subset of and a second subset of read compare levels for a second soft bit operation.

FIGS. 18 and 19 describe an intelligent grouping of the compare levels used for the first and second subsets of the second soft bit read operations. FIG. 18 again depicts the threshold voltage distribution of a population of programmed memory cells that store four bits of data. In FIG. 18, the initial threshold distribution existing just after programming data to the memory cells is illustrated by the solid line. The dotted line illustrates the same population of memory cells after some time has elapsed. As is illustrated, the threshold voltage of some of the memory cells has shifted over time, causing the distributions of threshold voltages for each memory state to shift. This shift in threshold voltage can lead to read errors that necessitate the use of error correction controls as has been described. For example, it can be seen that a memory cell at the lower edge of the state 15 distribution (distribution after elapsed time period) has a threshold voltage below the state 15 hard read compare level V15. It can be seen that each state distribution widens as a result of shifts in threshold voltage over time. Looking closely at FIG. 18, it is further seen that states 0-4 each demonstrate a propensity on the part of the cells to have a positive shift in threshold voltage over time. States 7-15 on the other hand tend to exhibit a negative shift in threshold voltage over time. By tailoring the first and second partial second soft bit reads based on this information, improved convergence performance may be obtained.

When reading at those states that tend to drift in the positive threshold voltage direction over time, more resolution as to a cell's position within that state on the upper end of the distribution is more likely to provide useful information. When reading at those states that tend to drift in the negative threshold voltage direction over time, more resolution as to a cell's position within that state on the lower end of the distribution is more likely to provide useful information. The first subset of compare levels can include the lower compare level for those states that tend to drift in the negative threshold voltage direction. The first subset can further include the higher compare level for the second soft bit read for those states that tend to drift in the positive threshold voltage direction. The higher level for the second soft bit is included in the second set of subreads for those states that tend to drift in the negative threshold voltage direction and the lower level for the second soft bit is included for those states that tend to drift in the positive direction.

FIG. 19 is a table of an exemplary partition of the subsets of compare levels for the second soft bit read operation. The described partition is based on the distributions described in FIG. 18. Each state in FIG. 19 is listed at the top of a column. Each row corresponds to a different operation that is performed as part of the read process. The first row sets forth the hard read compare levels for each state. During the normal read process, these comparison levels are used to sense the state of a selected memory cell. State 1 includes a V1 reference level, state 2 a V2 reference level, etc. The second row sets forth the compare levels used for the first soft bit operation. These comparison levels are chosen so as to bisect the corresponding distribution at its peak level to partition the distribution into two. State 1 includes a Sa1 reference level, state 2 a Sa2 reference level, etc. The third row sets forth the first subset of compare levels for the second soft bit operation. States 0-4 include the higher read compare levels Sb0H, Sb1H, Sb2H, Sb3H, Sb4H, and states 5-15 include the lower read compare levels Sb5H, Sb6H, Sb7H, Sb8L, Sb9L, Sb10L, Sb11L, Sb12L, Sb13L, Sb14L, Sb15L. The fourth row sets forth the second subset of compare levels for the second soft bit operation. States 0-4 include the lower read compare levels Sb0L, Sb1L, Sb2L, Sb3L, Sb4L, and states 5-15 include the higher read compare levels Sb5L, Sb6L, Sb7L, Sb8H, Sb9H, Sb10H, Sb11H, Sb12H, Sb13H, Sb14H, and Sb15H. Such an arrangement of the compare levels amongst the subsets can provide improved performance by retrieving and using the most useful information from the second soft bit read operation first. In many cases, it can be expected that the information from the first subset of compare levels will be enough to achieve convergence.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of reading non-volatile storage, comprising:
reading user data from a set of non-volatile storage elements using a first plurality of read compare points, each compare point corresponding to a programmable state of the storage elements;
reading a set of soft data from the set of storage elements at a higher bit resolution than said user data using a second plurality of read compare points having a larger number of read compare points than the first plurality; and
decoding the user data using a first subset of the soft data while reading to determine a second subset of the soft data.

2. A method according to claim 1, further comprising:
decoding the user data without the set of soft data prior to reading the set of soft data from the set of storage elements;
wherein reading the set of soft data is performed in response to a determination that decoding without the set of soft data is not successful.

3. A method according to claim 2, further comprising:
decoding the user data using the first subset and the second subset of soft data after reading to determine the second subset of the soft data.

4. A method according to claim 3, wherein:
reading to determine the second subset of soft data is performed in response to a determination that decoding using the first subset is not successful.

5. A method according to claim 3, wherein:
the set of soft data is a second set of soft data;
the method further comprises:
reading a first set of soft data from the set of storage elements using a third plurality of read compare points prior to reading the second set of soft data,
decoding the user data using the first set of soft data; and
reading the second set of soft data is performed in response to a determination that decoding using the first set of soft data is not successful.

6. A method according to claim 5, wherein:
decoding the user data without the first set of soft data includes accessing a first table of reliability metrics;
decoding the user data using the first set of soft data includes accessing a second table of reliability metrics;
decoding the user data using the first subset of the second set of soft data includes accessing a third table of reliability metrics; and
decoding the user data using the first and second subsets of the second set of soft data includes accessing a fourth table of reliability metrics.

7. A method according to claim 1, wherein:
the second plurality of read compare points includes a first subset of read compare points used to determine the first subset of data and a second subset of read compare points used after the first subset to determine the second subset of data;
the first subset of read compare points includes one or more read compare points associated with a lower threshold voltage portion of its corresponding programmable state and one or more read compare points associated with an upper threshold voltage portion of its corresponding programmable state; and
the second subset of read compare points includes one or more read compare points associated with a lower threshold voltage portion of its corresponding programmable state and one or more read compare points associated with an upper threshold voltage portion of its corresponding programmable state.

8. A method according to claim 1, wherein:
the second plurality of read compare points includes a first subset of read compare points used to determine the first subset of data and a second subset of read compare points used after the first subset to determine the second subset of data;
each read compare point of the first subset is associated with a lower threshold voltage portion of its corresponding programmable state; and
each read compare point of the second subset is associated with an upper threshold voltage portion of its corresponding programmable state.

9. A method according to claim 1, wherein:
decoding the user data includes performing one or more parity checks.

10. A method according to claim 1, further comprising:
providing the first subset of data from a memory chip to an error correction controller prior to reading the second subset of data.

11. A method according to claim 1, wherein:
the read compare points are read reference threshold voltages.

12. A method according to claim 1, wherein:
the read compare points are read reference currents.

13. A method according to claim 1, wherein:
reading includes at least one of voltage sensing and current sensing.

14. A method according to claim 1, wherein:
decoding the user data includes iterative probabilistic decoding.

15. A method according to claim 1, wherein:
the user data includes one or more parity bits.

16. A method according to claim 1, wherein:
the set of non-volatile storage elements is a set of NAND flash storage elements.

17. A method according to claim 1, wherein:
the set of non-volatile storage elements is a set of multi-state flash storage elements.

* * * * *